(12) United States Patent
Aota et al.

(10) Patent No.: US 11,644,331 B2
(45) Date of Patent: May 9, 2023

(54) PROBE DATA GENERATING SYSTEM FOR SIMULATOR

(71) Applicant: INTERNATIONAL BUSINESS MACHINES CORPORATION, Armonk, NY (US)

(72) Inventors: Kentaro Aota, Aichi (JP); Yoshifumi Sakamoto, Shiga-ken (JP); Yuki Hashimoto, Kanagawa-ken (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 447 days.

(21) Appl. No.: 16/804,813

(22) Filed: Feb. 28, 2020

(65) Prior Publication Data

US 2021/0270630 A1 Sep. 2, 2021

(51) Int. Cl.
*G01C 21/36* (2006.01)
*G05D 1/02* (2020.01)
*G06V 20/54* (2022.01)
*G06F 30/20* (2020.01)

(52) U.S. Cl.
CPC ..... *G01C 21/3647* (2013.01); *G01C 21/3697* (2013.01); *G05D 1/0212* (2013.01); *G06F 30/20* (2020.01); *G06V 20/54* (2022.01)

(58) Field of Classification Search
CPC . G01C 21/3647; G01C 21/3697; G06F 30/20; G06V 20/54; G05D 1/0212
See application file for complete search history.

(56) References Cited

U.S. PATENT DOCUMENTS 9,165,477 B2 10/2015 Wilson
10,345,811 B2 7/2019 Phillips et al.
(Continued)

FOREIGN PATENT DOCUMENTS

CN 108304986 A 7/2018
CN 108765235 A 11/2018
(Continued)

OTHER PUBLICATIONS

Well, P. et al., "The NIST Definition of Cloud Computing" NIST Special Publication (2011) 7 pages.
(Continued)

*Primary Examiner* — Yazan A Soofi
*Assistant Examiner* — Naeem Taslim Alam
(74) *Attorney, Agent, or Firm* — Tutunjian & Bitetto, P.C.; Michael A. Petrocelli

(57) ABSTRACT

A computer implemented method for generating traffic pathways that includes recording images from a transportation site with a fixed position camera. The method further includes extracting vehicle point data from the images, and calculating projected vehicle characteristics from the extracted point data to provide an extracted vehicle continuous data set. The method may further include generating a simulated traffic flow and simulated vehicle motion from the extracted vehicle continuous data set. A traffic pathway can be calculated using simulated vehicle motion and simulated traffic flow. The traffic pathway can be used for directing a guided vehicle on the transportation site.

19 Claims, 11 Drawing Sheets

(56) References Cited

U.S. PATENT DOCUMENTS

| | | | |
|---|---|---|---|
| 2012/0310521 A1* | 12/2012 | Takeuchi | G01C 21/3476 701/408 |
| 2016/0005313 A1* | 1/2016 | Cholayil | G08G 1/04 340/907 |
| 2016/0253902 A1* | 9/2016 | Yokoi | G08G 1/143 348/149 |
| 2017/0124505 A1* | 5/2017 | Nakfour | H04W 4/90 |
| 2017/0132117 A1 | 5/2017 | Stefan et al. | |
| 2017/0147722 A1 | 5/2017 | Greenwood | |
| 2017/0300657 A1 | 10/2017 | Barrett | |
| 2018/0149487 A1* | 5/2018 | Lee | G01C 21/005 |
| 2018/0211120 A1 | 7/2018 | Smith et al. | |
| 2019/0061776 A1* | 2/2019 | Kindo | B60W 30/10 |
| 2019/0065933 A1 | 2/2019 | Bogdoll et al. | |
| 2019/0108384 A1* | 4/2019 | Wang | G06V 20/13 |
| 2019/0129436 A1* | 5/2019 | Sun | G05D 1/0088 |
| 2019/0163181 A1 | 5/2019 | Liu et al. | |
| 2019/0179738 A1 | 6/2019 | Hawthorne et al. | |
| 2019/0235521 A1 | 8/2019 | Mudalige et al. | |
| 2019/0236380 A1 | 8/2019 | Fukuhara et al. | |
| 2019/0355256 A1 | 11/2019 | Bielby | |
| 2020/0082727 A1* | 3/2020 | Zhao | G05D 1/0295 |
| 2020/0180647 A1* | 6/2020 | Anthony | G06V 20/56 |
| 2020/0193721 A1* | 6/2020 | Khim | G07B 15/02 |
| 2020/0365013 A1* | 11/2020 | Simon | H04W 76/10 |
| 2021/0182581 A1* | 6/2021 | Usui | G06V 20/582 |
| 2021/0237772 A1* | 8/2021 | Meltz | G06F 30/20 |
| 2021/0334420 A1* | 10/2021 | Du | G06F 30/20 |

FOREIGN PATENT DOCUMENTS

| | | |
|---|---|---|
| CN | 108961798 A | 12/2018 |
| CN | 109871599 A | 6/2019 |
| CN | 109885870 A | 6/2019 |
| CN | 110352153 A | 10/2019 |
| CN | 110544380 A | 12/2019 |
| JP | H09211678 A | 8/1997 |
| JP | H11272158 A | 10/1999 |
| JP | 2002163747 A | 6/2002 |
| JP | 2008217113 A | 9/2006 |
| JP | 2008117082 A | 5/2008 |
| JP | 2008299458 A | 12/2008 |
| JP | 2009245042 A | 10/2009 |
| JP | 2015090679 A | 5/2015 |
| JP | 2016534325 A | 11/2016 |
| JP | 2017036135 A | 2/2017 |
| JP | 2017068712 A | 4/2017 |
| JP | 2017173309 A | 9/2017 |
| JP | 2018077835 A | 5/2018 |
| JP | 2019043157 A | 3/2019 |
| JP | 2019512824 A | 5/2019 |
| JP | 2019114005 A | 7/2019 |
| WO | 2004008744 A | 1/2004 |
| WO | 2018101851 A | 6/2018 |

OTHER PUBLICATIONS

List of IBM Patents or Patent Applications Treated as Related dated Aug. 30, 2021, 2 pages.

Kuzumaki, S., "What about Japan's autonomous driving following death accident in the United States?" https://newswitch.jp/p/13269 (Jun. 2018) pp. 1-14.

Nakata, A., "Autonomous driving technology understands the development capabilities of Dantotsu and Weimo by numbers" Silicon Valley Next Report (Feb. 2018) pp. 1-3.

Yoshida, J., "Driving Development Increase the Importance of Simulation?" EE Times (Apr. 2018) pp. 1-5.

Ohnsman, A., "Declaration of automatic driving realized by Toyota president "14.2 billion km test run"" Forbes Japan (Oct. 2016) pp. 1-4.

Yikai, K. et al., "Simulation of Drivers Maneuvering around obstacles and analysis of Traffic congestion using Network-structured models based on fuzzy inferences" (Dec. 2001) pp. 90-97, vol. 42, No. SIG 24, English abstract.

Fujii, H. et al., "Modeling of Traffic Accident in Multi-agent-based Traffic Simulator" (Jan. 2011) pp. 42-49, English abstract.

Zamith, Marcelo, et al. "A new stochastic cellular automata model for traffic flow simulation with drivers' behavior prediction." Journal of computational science 9, Jul. 2015, pp. 51-56.

Gora, Pawel. "Traffic Simulation Framework—a cellular automaton-based tool for simulating and investigating real city traffic." Recent Advances in Intelligent Information Systems 642653, Jan. 2009, pp. 641-653.

Lan, Lawrence W., et al. "Cellular automaton simulations for mixed traffic with erratic motorcycles' behaviours." Physica A: Statistical Mechanics and its Applications, May 2010, pp. 2077-2089, 389,10.

Ming-Zhe, Liu, et al., "A cellular automaton model for heterogeneous and incosistent driver behavior in urban traffic." Communications in Theoretical Physics, Nov. 2012, pp. 744-748, 58,5.

International Search Report and Written Opinion dated May 7, 2021 in related PCT Application No. PCT/IB2021/050700, pp. 1-9.

Office Action for related case U.S. Appl. No. 16/804,737 dated Aug. 17, 2021, 39 pages.

USPTO Transmittal Form PTO/SB/21 (07-09), dated Aug. 30, 2021, pp. 1-2.

\* cited by examiner

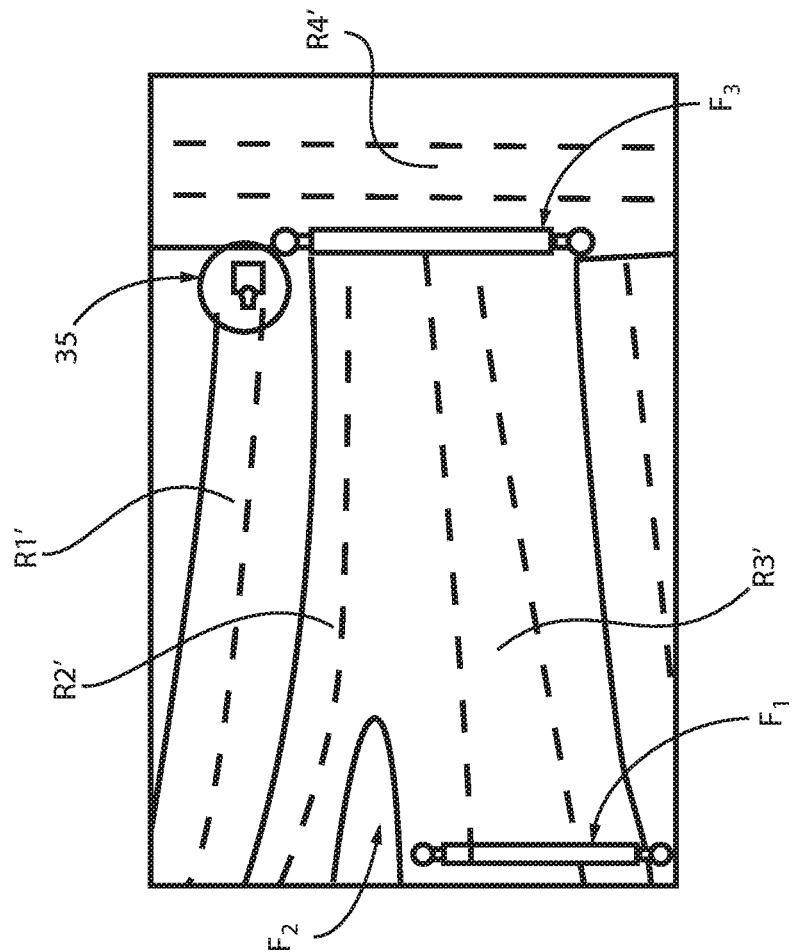
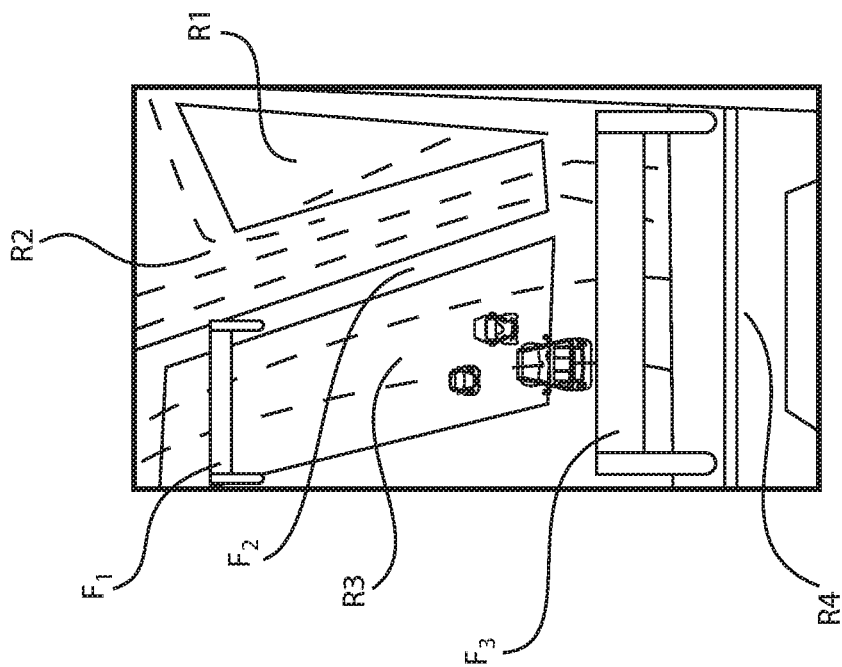
FIG. 5
FIG. 6

PROBE DATA GENERATING SYSTEM FOR SIMULATOR

BACKGROUND

Technical Field

The present invention relates generally to autonomous vehicles, and more particularly to simulators used for autonomous vehicles.

Description of the Related Art

Autonomous vehicles are growing in popularity. In the development of autonomous driving vehicle and ADAS (advanced driver-assistance systems), it is known that evaluation under simulation environments is useful for the at least two reasons. For example, vehicles under development and evaluation target vehicles whose safety has not been confirmed generally cannot be evaluated in actual traffic flows. Additionally, evaluation of autonomous driving vehicles under complex conditions in an actual traffic flow are generally are not possible in a limited environment, such as a test course.

SUMMARY

According to aspects of the present disclosure, a system, method, and computer program product is provided to generate test scenarios for vehicle simulations from a fixed point device that is recording images.

In one embodiment, a computer implemented method is provided to generate test scenarios for vehicle simulations from a fixed point device recording video. In one embodiment, the method for generating traffic pathways on a transportation site may include recording images from the transportation site with a fixed position camera, and projecting the recorded images onto a map. Extracted fixed image features from the recorded images are substantially matched to extracted fixed map features from the map to correlate the map to the transportation site. In some embodiments, the method further includes extracting vehicle point data from the images recorded by the fixed position camera, and calculating projected vehicle characteristics from the extracted point data to provide a vehicle continuous data set for the vehicle being imaged by the fixed position camera. The method may further include generating a simulated traffic flow from the vehicle continuous data set, and generating simulated vehicle motion from the vehicle continuous data set. A traffic pathway can be generated using the simulated vehicle motion and the simulated traffic flow. The traffic pathway is for directing a guided vehicle on the transportation site.

In another aspect, a simulation system is provided that generates traffic pathways. In one embodiment, the simulation system includes an interface for receiving images recorded from the transportation site by a fixed position camera, and an image to map converter for projecting the recorded images onto a map, wherein extracted fixed image features from the recorded images substantially match extracted fixed map features from the map to correlate the map to the transportation site. The simulation system further includes an image data extractor for extracting vehicle point data from the images recorded by the fixed position camera. The system further includes a traffic flow simulator that calculates a simulated traffic flow from the vehicle point data; and a vehicle motion simulator that calculates simulated vehicle motion from the vehicle point data. In some embodiments, the system further includes a traffic pathway calculator including a processor configured for generating a traffic pathway from the simulated vehicle motion and the simulated traffic flow, wherein the traffic pathway is for directing a guided vehicle on the transportation site.

In another aspect, the present disclosure provides a computer program product including a computer readable storage medium having computer readable program code embodied therein for a method for generating traffic pathways on a transportation site. The method actuated by the computer program product may include recording images from the transportation site with a fixed position camera; and projecting the recorded images onto a map. Extracted fixed image features from the recorded images are substantially matched to extracted fixed map features from the map to correlate the map to the transportation site. In some embodiments, the method further includes extracting vehicle point data from the images recorded by the fixed position camera; and calculating projected vehicle characteristics from the extracted point data to provide a vehicle continuous data set for the vehicle being imaged by the fixed position camera. The method may further include generating a simulated traffic flow from the vehicle continuous data set; and generating simulated vehicle motion from the vehicle continuous data set. A traffic pathway can be generated using the simulated vehicle motion and the simulated traffic flow. The traffic pathway is for directing a guided vehicle on the transportation site.

These and other features and advantages will become apparent from the following detailed description of illustrative embodiments thereof, which is to be read in connection with the accompanying drawings.

BRIEF DESCRIPTION OF THE DRAWINGS

The present invention is described in the detailed description which follows, in reference to the noted plurality of drawings by way of non-limiting examples of exemplary embodiments of the present invention.

FIG. 5 illustrates one example of how the video taken by a fixed position camera may be divided into different regions.

FIG. 6 illustrates how the different regions from the video depicted in FIG. 5 are projected onto a map.

DETAILED DESCRIPTION

Figure 1:
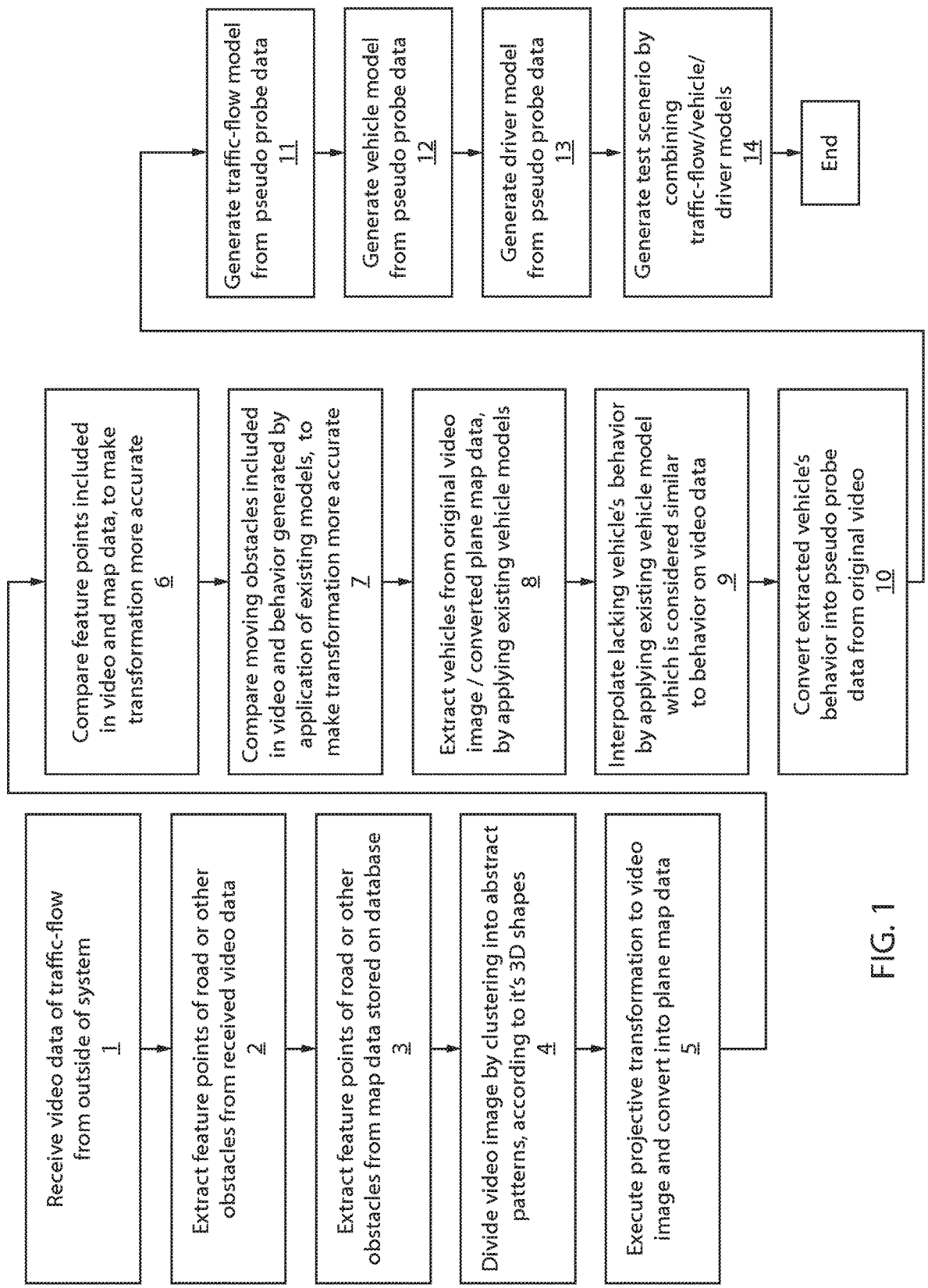
FIG. 1 depicts a block/flowchart of an exemplary computer implemented method for implementing a pseudo probe data generating system to capture data for use in a vehicle simulator.

Aspects of the present invention relate generally to autonomous vehicles and to generating test scenarios for vehicle simulations from a fixed point device taking video. In some examples, vehicle simulation environments are premised on execution of a simulation with an input of a scenario generated by an operator based on knowledge that he/she may have obtained in the past, or with a scenario obtained by probe information. In these examples, the probe information may be obtained using, e.g., probe cars.

In such scenario input-based environments, it can be important to generate a wide variety of scenarios efficiently without taking many man-hours. It has been determined that manual generation of scenarios by operators can have the problems of variation in quality due to dependency on the individual skills or knowledge, and limitations in the number of scenarios due to costs for the generation. Further, in some instances, generation of simulation scenarios based on probe information, e.g., cars (hereafter referred to as "probe cars") including probe sensors for obtaining data suitable for simulations, disadvantageously have high associated data collection costs. In some instances, the high data collection costs can be attributed to the probe cars. Additionally, the patterns being used by those in those data collection runs, e.g., the collection runs by the probe cars, can be limited, because the subjects, e.g., probe cars, used for the probe data collection can be limited to the areas around which the probe cars can actually travel to. For example, if the probe cars can not travel to roads/pathways due to accidents, such as collisions, or other equivalent dangerous situations, which obstruct travel of the probe car; data collection can not be taken from these regions. Further, during the data collection extraction of collisions or equivalent dangerous situations is difficult.

In some embodiments, the methods, systems and computer program products of the present disclosure can overcome the aforementioned difficulties in generating various test scenarios without being limited to vehicle probes measuring real traffic flows. In some embodiments, the methods, systems and computer program products employ combinations of traffic flow models, vehicle models, and driver models that are generated from pseudo probe information. In some embodiments, the pseudo probe information is generated from video images, e.g., motion picture, that are taken by a fixed point camera. Furthermore, the methods, systems and computer program products that are described herein can enable the generation of simulation scenarios efficiently, while enhancing accuracy of the pseudo probe information by feeding these models back to the pseudo probe information generation process.

Some features of the present invention not previously practiced in generating simulation scenarios may include a conversion of a "non-bird's" eye view of a video and/or image to a planar projection. "Planar projections" are the subset of 3D graphical projections constructed by linearly mapping points in three-dimensional space to points on a two-dimensional projection plane. The projected point on the plane is chosen such that it is collinear with the corresponding three-dimensional point and the center of projection. The lines connecting these points are commonly referred to as projectors.

In some embodiments, the conversion is not of the entire shooting range, but instead the subject is limited to vehicles and equivalent moving objects, such as motorcycles, bicycles and/or pedestrians. In some embodiments, the subject for analysis employed in the methods, systems and computer program products is the traffic flow, which is the movement of vehicles and equivalent objects. In some embodiments, the methods, systems and computer program products that are described herein can control, e.g., minimize, analysis cost by having access to reference maps including the roads on which the traffic is being measured, in which the reference maps are stored in a database. The database of reference maps is accessible to the systems, methods and computer program products from the beginning of the analysis.

The access to the reference maps are also a mechanism by which the disclosed computer implemented methods and systems can reduce any misalignment caused by the planar projection. For example, the computer implemented methods, systems and computer program products enable high speed planar projections by storing reference maps in a subsystem, e.g., a database. The database of reference maps can provide information directed to feature points suitable for the conversion of the projection from a 'non'-bird's-eye view of a video or still image to planar projection.

In some embodiments, the computer implemented methods, systems and computer program products can provide accurate and high-speed projection conversion by dividing a subject video or still image based on its three-dimensional shape as preprocessing of conversion from a 'non'-bird's-eye view to planar projection and employing parameters suitable for the respective spaces.

In some embodiments, the computer implemented methods, systems and computer program products can generate models of different grain sizes of "traffic flows", "vehicles" and "drivers" from pseudo probe information, wherein the pseudo probes have access, e.g., through stored databases, to information necessary for generation of models.

In some embodiments, the computer implemented methods, systems and computer program products by storing generated models in a database and supplement the missing information in generation of a pseudo probe can dynamically generate behavior from suitable existing models, which can be stored in accessible databases. The models can be searched from the databases, and this can enable a more precise information supplement.

The methods, systems and computer program products are now described in further detail with reference to FIGS. 1-13.

Figure 2:
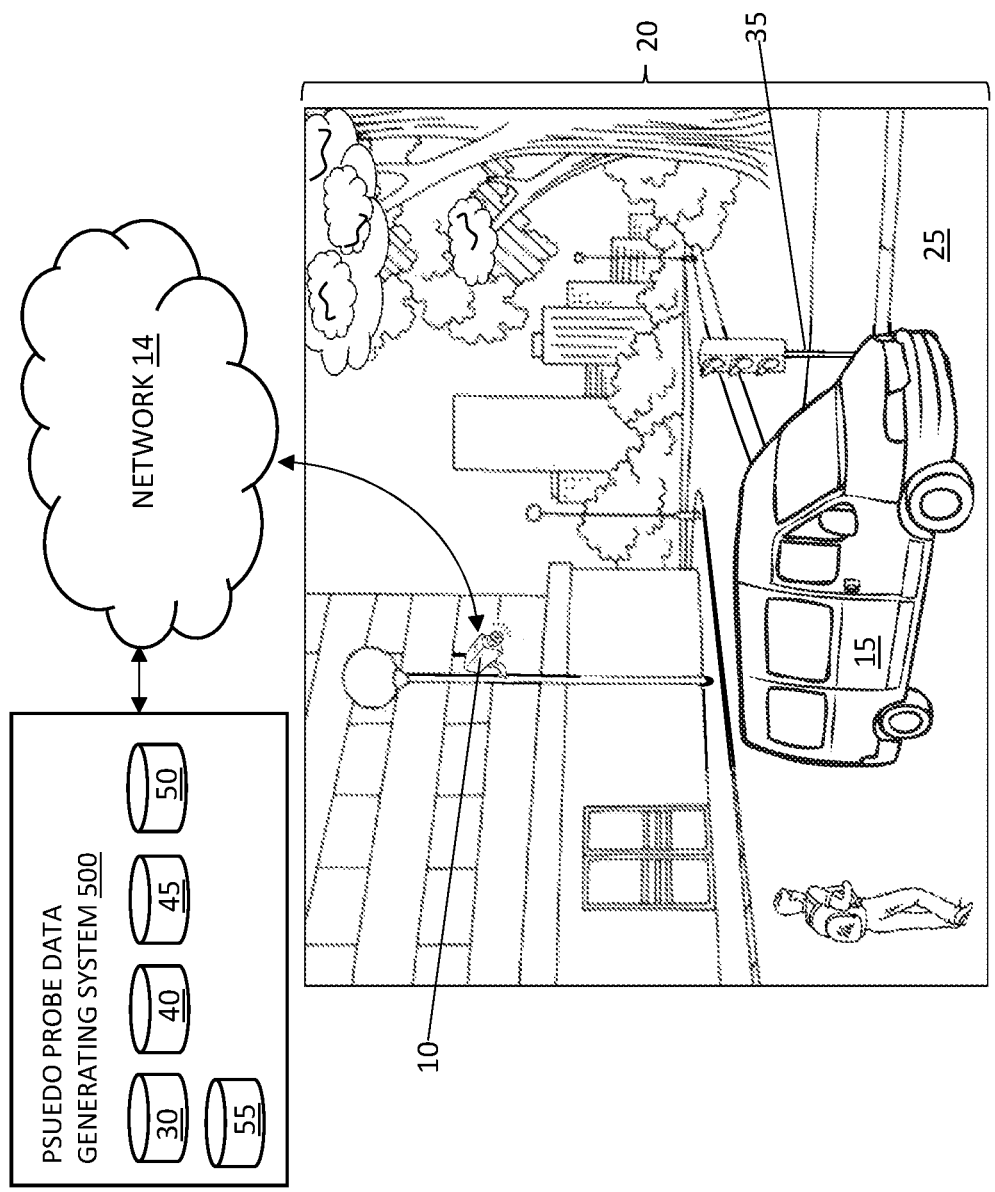
FIG. 2 is an illustration of a sample application from which images may be recorded using a camera in a fixed position.
Figure 11:
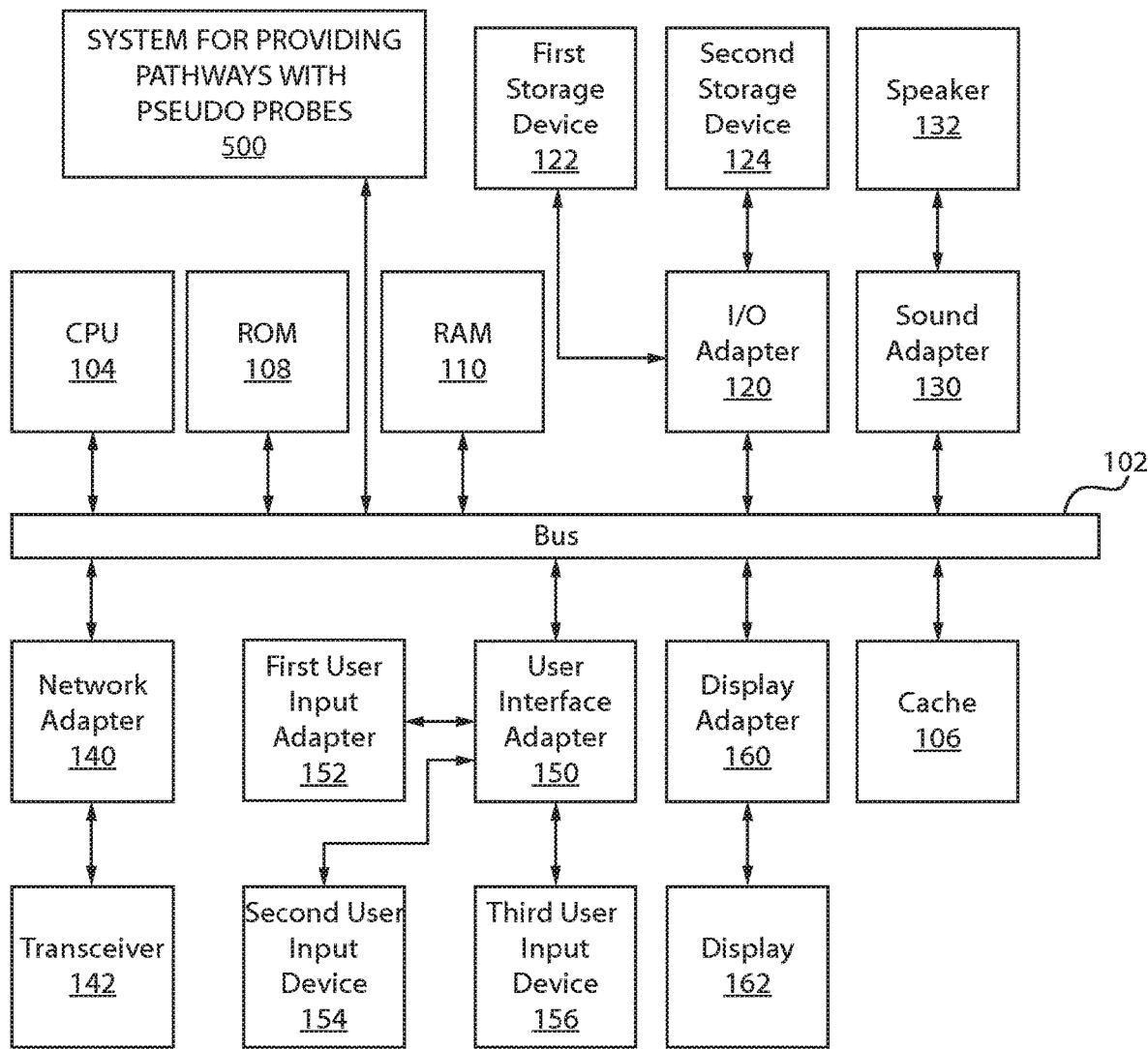
FIG. 11 is a block diagram illustrating a processing system that can incorporate the system for providing a requirement depicted in FIG. 10.

FIG. 1 depicts a block/flowchart of an exemplary computer implemented method for implementing pseudo probe to capture data for use in a vehicle simulator. FIG. 2 is an illustration of a sample application from which images may be recorded using a camera in a fixed position. FIG. 11 is a block diagram illustrating some components of a system 500 for generating traffic pathways using pseudo probes.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring to FIG. 1, in some embodiments the computer implemented method for implementing pseudo probes to capture data for use in a vehicle simulators may begin with analyzing an image, e.g., video image, taken from a particular site. The term "pseudo probe" denotes that data is tracked by a fixed position camera 10, as opposed to cameras that are mounted to moveable objects, such as vehicles, e.g., probe cars. The pseudo probe data is generated by tracking each of detected vehicles 15 on an image, e.g., video image, and extracting information that is particular to the vehicle 15 being tracked.

The method may begin with recording images at a site 20 (transportation site) from which data is recorded to be used to provide a vehicle simulator, at block 1. In some embodiments, the recorded images are of traffic pathways, roads and/or vehicles without a degree of clarity that could invade individual privacy. In some embodiments, block 1 may include receiving data of traffic flow to the system 500 for generating traffic pathways using pseudo probes, e.g., fixed position cameras 10. In some embodiments, a base video image of a traffic flow is taken by a fixed position camera 10 installed on a road, or within the vicinity of a road 25, or any other structure on which vehicles 15 travel. In some embodiments, the video image can be one taken from a "non-bird eye" viewpoint. A "bird's-eye" view is an elevated view of an object from above, with a perspective as though the observer were a bird, often used in the making of blueprints, floor plans, and maps. In some embodiments, a bird's eye view can be considered as a view from above the objected being viewed looking straight down. A "non-bird's" eye view may still be elevated, however the line of sight from the point at which the image is taken is at an angle less than 90 degrees.

As noted, the camera 10 for taking the image is at a fixed position. The term "fixed position" means that the camera is not moving, and is stationary relative to the ground of the earth underlying the camera 10. This is distinguished from a camera that is mounted to a movable object such as a car that travels over a portion of the ground.

Figure 10:
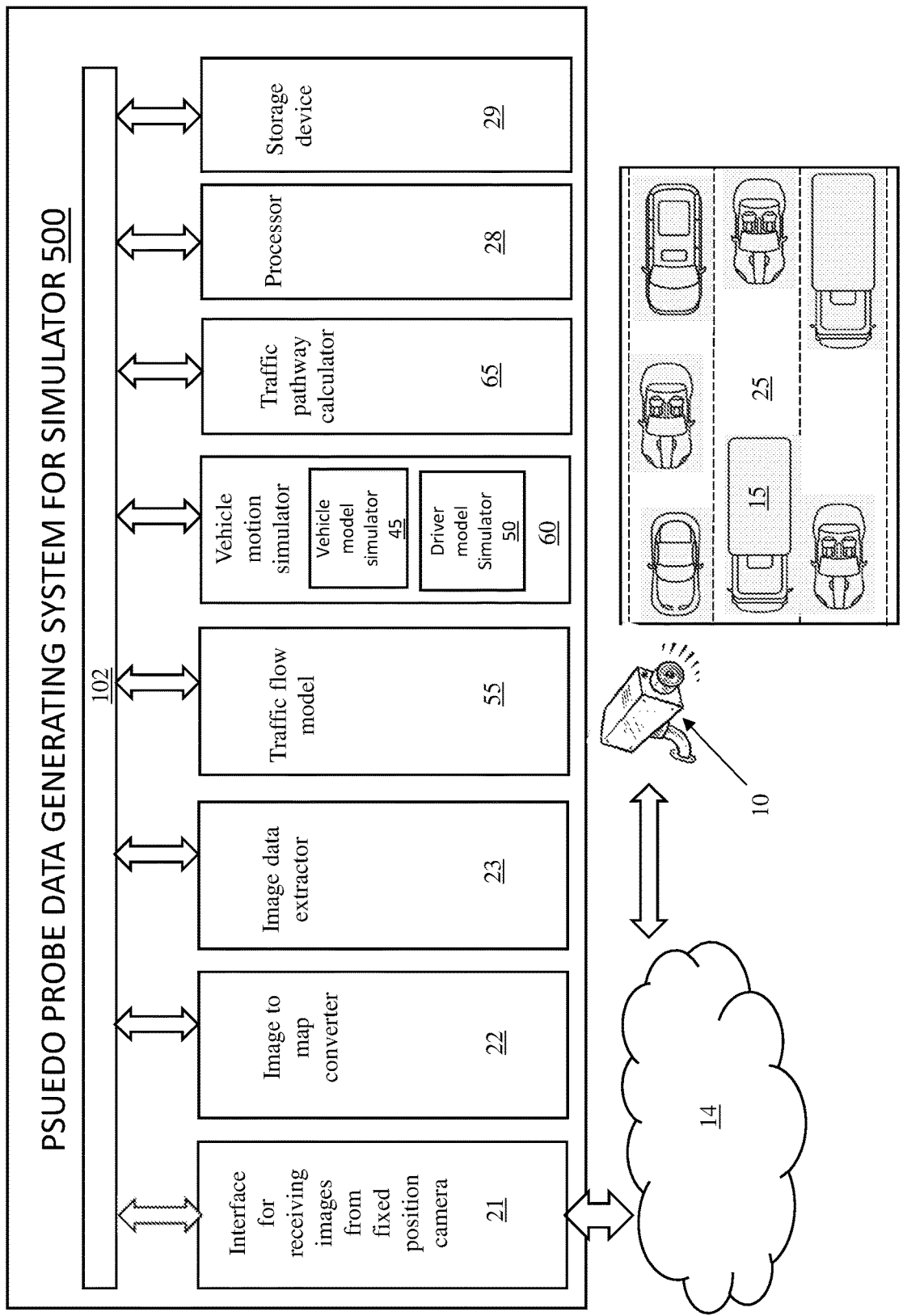
FIG. 10 is a block diagram illustrating some components in a system for generating traffic pathways using pseudo probe data.

The camera 10 for taking the image may be a camera used for motion picture acquisition. For example, the camera 10 can make a continuous motion recordation of a vehicle 15 as it is traveling from one point to a second point. In some examples, the camera 10 may be a video camera, a webcam, web camera, camcorder, closed circuit television, camera 10 integrated into a mobile device, such as a smart phone and/or mobile computer, or any combination thereof. Referring to FIG. 10, the images taken by the camera 10 may be received at the system 500 through the interface 21 for receiving images.

In some embodiments, the method may continue to block 2 of FIG. 1, which can include extracting data from the images, e.g., video data, that was recorded by the fixed position cameras 10, and received by the system 500 for generating traffic pathways using pseudo probes, e.g., fixed position cameras 10. In one embodiment, the feature points extracted from the images taken by the camera 10 may be roads, or other obstacles related to the roads. For example, a feature point may be a curve in the road, a point at which two roads intersect, a change in the number of lanes in a road, etc. The extracted information may be static information, such as the positions, size, e.g., width and height, and shape of each fixed object. This extracted information may be used in providing the simulation from the data recorded through the pseudo probes.

Figure 3:
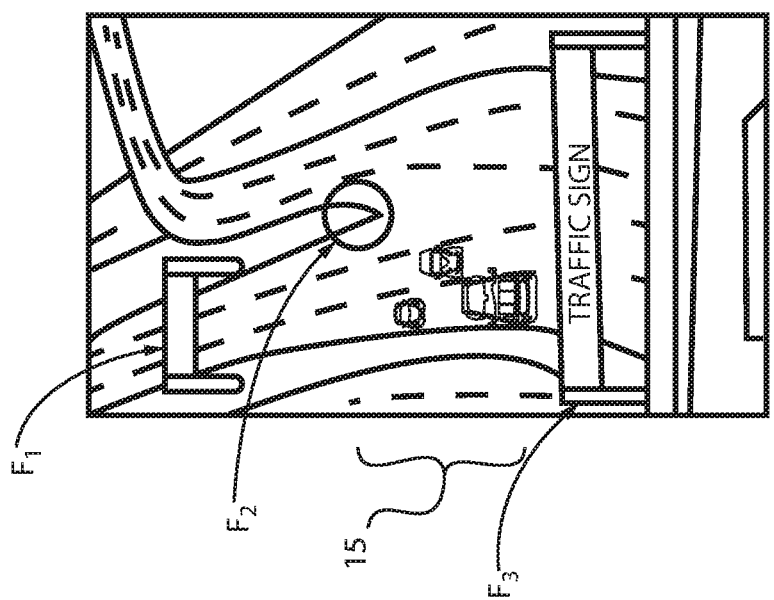
FIG. 3 is an illustration of a video taken from a transportation site by a fixed position camera including vehicles and fixed feature points.

FIG. 3 is an illustration of a video taken from a transportation site 20 by a fixed position camera 10 including feature points F1, F2, F3. In the embodiment that is depicted in FIG. 3, the fixed position feature points may be road signs, F1, F3, and may also include a curb F2 at the point where to separate roads merge. Each of these feature points F1, F2, F3 may be the data that is extracted from the image at block 2 of the method. Referring to FIG. 10, an image data extractor 23 of the system 400 may extract the features points F1, F2, F3 from the image.

At block 3 of the method depicted in FIG. 1, the method may continue with extracting features points of a road or other obstacles from a map corresponding to where the image was recorded. In some embodiments, the method may include accessing a map of the area, e.g., site 20, that is stored in a map database 30, in which the map corresponds to where the image was recorded. In some embodiments, the maps are available on a database 30 of maps that are recorded prior to the image being taken at block 1. In this manner, the maps are provided in advance of the process steps for the images in creating data for the simulation that can be employed in autonomous vehicle development. The road feature points and natural/artificial feature points on the map are extracted for comparison with features points that are extracted from the image.

Figure 4:
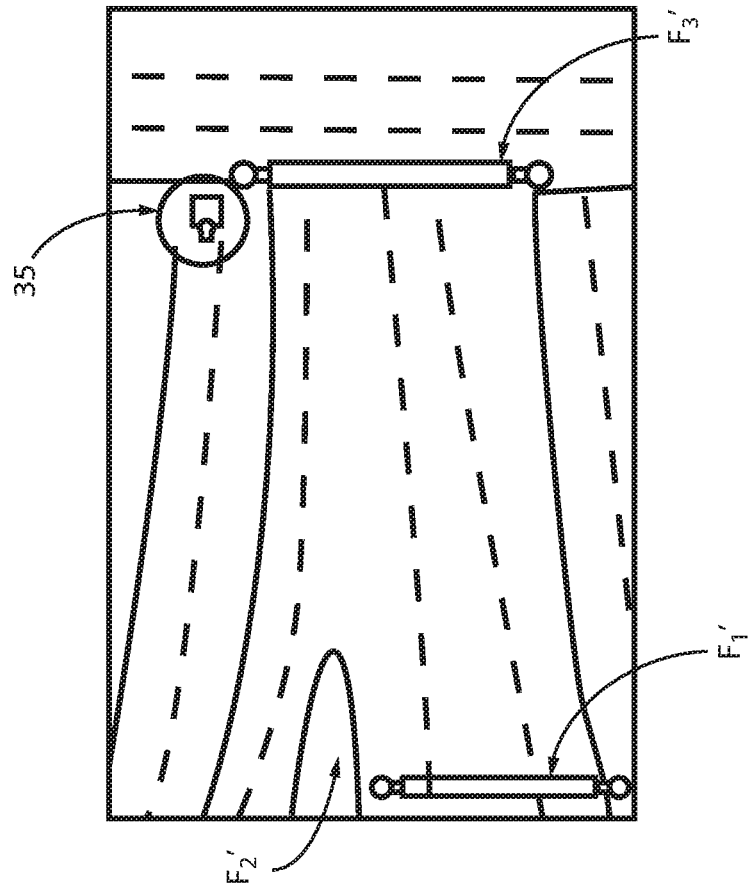
FIG. 4 is an illustration of a map correlated to the image that is depicted in FIG. 3, in which extracted fixed image feature points from the video are matched to extracted fixed map features from the map.

FIG. 4 is an illustration of a map correlated to the video image that is depicted in FIG. 3, in which extracted feature points from the video are matched to extracted data points from the map. In the example, the feature points from the video illustrated in FIG. 3 identified by reference numbers F1, F2, F3 are designated in FIG. 4 by reference numbers F1', F2', F3', respectively.

In some embodiments, the computer implemented method includes projecting the extracted features F1, F2, F3 image taken from the camera 10 that is recording from a non-bird's eye view onto a map available from a database of maps 30 including relevant mapped information suitable for creating an autonomous vehicle simulation, such as mapped roadways, mapped conditions, and/or mapped driving regulations for travel on the relevant roads. In some embodiments, because the image is taken from a non-bird eye view, the computer implemented method can project the image, e.g., video image, onto a map, e.g., a map including roads. The map that the non-bird eye perspective image is projected onto may be planar map and/or a three-dimensional (3D)

map. The maps onto which the image is projected can be stored on memory, e.g., hardware memory, such as a hard drive, solid state memory and/or cloud-based memory.

In some embodiments, the projection of the bird's eye view image onto a map is considered pre-processing for generating the pseudo probe information.

Projection of features from the video image taken by the fixed position cameras 10 of the pseudo probes onto a map may begin with dividing the image, e.g., video image, by clustering into patterns, such as abstract patterns at block 4 of the method depicted in FIG. 1. Projection of features from the video image taken by the fixed position cameras 10 of the pseudo probes onto a map may begin with diving the image, e.g., video image, by clustering into patterns, such as abstract patterns at block 4 of the method depicted in FIG. 1. The patterns clustered on the image are compared to patterns clustered on the maps. Through this mechanism, the images and the maps may be correlated for the projection step. The databases of maps 30 and the storage reference images of objects 40 depicted in FIG. 1 may be stored in the storage device 29 of the system 500 depicted in FIG. 10.

In some embodiments, preprocessing for projective conversion may include the space in the video image and the space on the planar or 3D map being divided based on the three-dimensional (3D) shape of the road. In some embodiments, the projection is performed using parameters suitable for the respective divisional spaces. FIG. 5 illustrates one example of how the video taken by a fixed position camera 10 may be divided into different regions R1, R2, R3, R4, R5. FIG. 6 illustrates how the different regions from the video are projected onto the map. In the example, the regions from the video illustrated in FIG. 5 identified by reference numbers R1, R2, R3, R4, R5 are designated in FIG. 6 by reference numbers R1', R2', R3', R4', R5', respectively.

Figure 7:
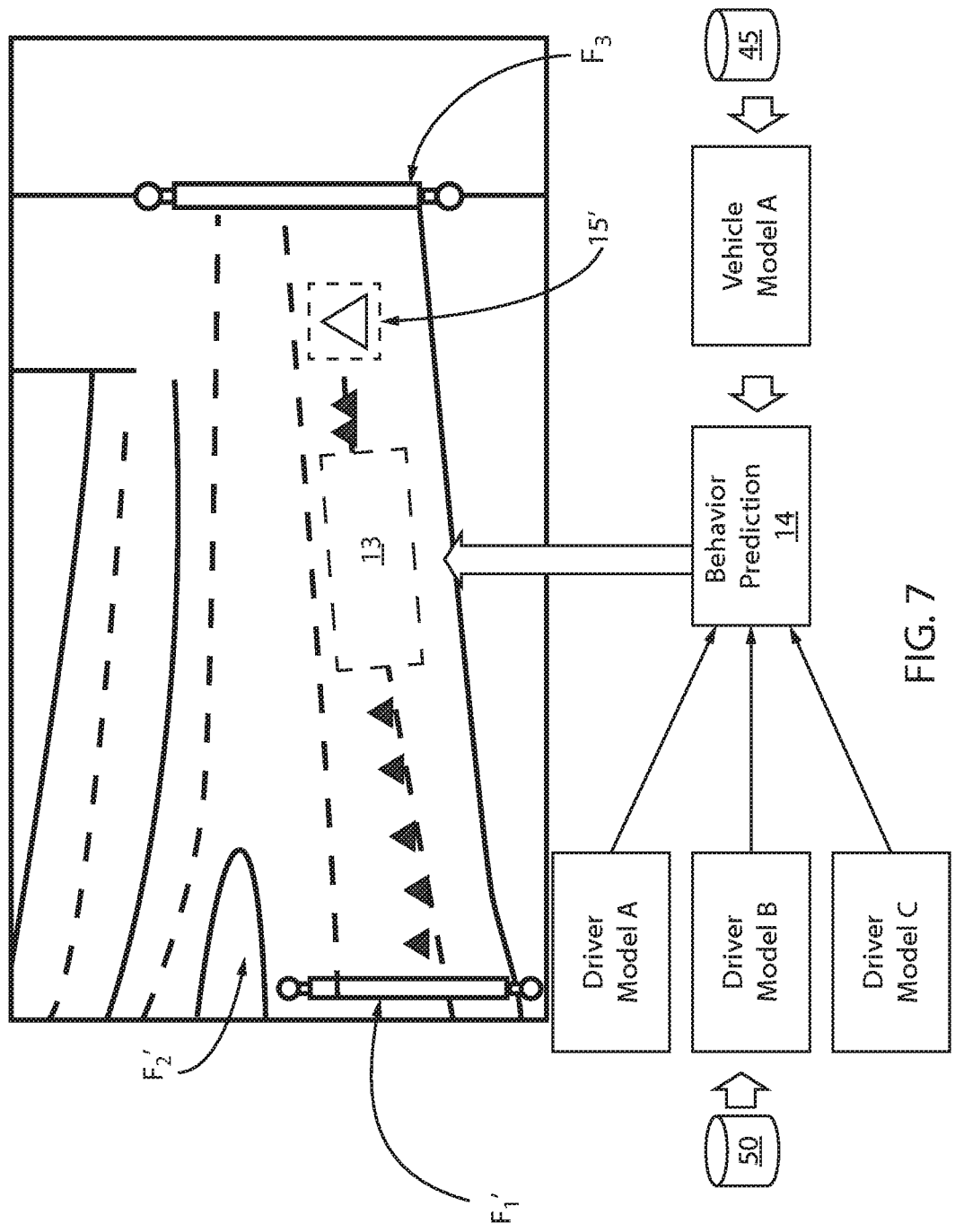
FIG. 7 illustrates on a projection of data onto a map how vehicle models and driver models can provide data to fill data points not collected by video taken from a fixed position camera.

Referring back to FIG. 1, the method may continue to executing projective transformation of the images, e.g., video images, taken from the fixed position cameras 10, and converting the features executed from the images onto the plane map data at block 5. This projection of features extracted from the video images onto the plane map data is depicted in FIGS. 4, 6 and 7.

The method may further include the comparing feature points that were extracted from the images, e.g., video images, and the feature points that were extracted from the map data at block 6. This provides for a strong transformation of the data in the projection of the video images onto the map.

In some embodiments, road feature points and natural/artificial feature point from the image taken from the camera 10 at the site 20, and road feature points and from the natural/artifact feature points on the (two or three-dimensional map) are extracted and the extracted feature points are associated with each other, enabling projection of the position of each vehicle detected on the video image on the map, e.g., a planar or three dimensional map. The system 500 includes a database 30 of maps including meta information of fixed objects that are candidates of the feature points as a sub-system, and enables efficient and accurate projection by searching for "feature point candidates" present on the planar or three dimensional (3D) map matching the shooting range of the camera 10 taking the video image of the site 20, and selecting a point that meets best conditions.

In some embodiments, because optimized calculation expression for projective conversion depends on the original shape on the three-dimensional space, accurate projective conversion and pseudo probe information generation can be provided by this processing step.

In some embodiments, the recognition of the three-dimensional shape in the images may be performed using a computer vision module. The computer vision module may employ artificial intelligence utilizing computer software programs that analyze the images from the cameras 10 in order to recognize objects. The A.I. program functions by using machine vision. Machine vision is a series of algorithms, or mathematical procedures, which work like a flow-chart or series of questions to compare the features from the images taken by the camera 10 with stored reference images of objects 40 in different angles, positions and movements. Combining all of the values from the various images taken by the camera 10 from the site 20, and the comparing those images to the reference images of objects 40, an overall ranking is derived which gives the A.I. the probability that an item, e.g., extracted feature, from the video image matches a feature on the maps. This type of A.I. is known as "rule-based". In some embodiments, the computer vision module includes at least one hardware processor for executing a series of instructions for analyzing the images taken by the camera 10, and comparing the images to comparison objects from the data saved in the stored reference images of objects 40.

The projection of extracted data from the image taken at block 1 onto the map at block 4 may then be employed to generate pseudo probe information for the subject site 10 at block 5 of the method depicted in FIG. 1. In some embodiments, the generated pseudo probe information associated with the subject site 20 and conditions and stored in the database 40. The conditions for the subject site 20 by which the pseudo probe information is generated may include data directed to the season of a calendar year, the time period at which the image was taken, and the weather at the subject site 20 at which the image was taken.

Feature values may vary depending on the road shape in the traffic flow included in the probe information and these conditions, and the associated attributes are used in later-described model generation. It is noted that the camera 10 depicted in FIG. 1 is only directed to a single site 20. The methods, systems and computer program products that are described herein can employ a number of cameras at a number of different sites. Each camera can provide a pseudo probe, i.e., different pseudo probe. Blocks 3-6 of FIG. 1 may be executed by an image to map converter 22 of the system 500.

In some embodiments, the method may continue to comparing moving obstacles in the images, e.g., video images, taken from the fixed point cameras 10 to the behavior generated by the application of existing models at block 7. Not only static information, such as the positions, size (height and width) and shape of each fixed object, a correlation with a traffic flow model around a fixed object, which can also be dynamically added or updated as the meta information. For example, where a feature point is a traffic light, it can be expected that a traffic flow around the fixed object, e.g., feature point, repeatedly stops and starts at regular intervals. These obstacles may be added to the pseudo probe at block 7 of the method depicted in FIG. 1.

Referring to block 8 of the method depicted in FIG. 1, the method may further include extracting vehicle data from the original image, e.g., video image, and converted map data by applying existing vehicle models. In some embodiments, the method may include comparing moving obstacles that are included in video and behavior generated by application of existing models to make transformation more accurate at block 8. In some embodiments, the object detection is limited to vehicles or equivalent moving objects. For example, the vehicles and equivalent moving objects to which the detection can be limited may include cars, trucks, motorcycles, bicycles, and pedestrians, etc. The information extracted that is particular to the vehicle may include the position of the vehicle on the road from which it is recorded, the speed of the vehicle at the time the image is recorded, the direction (angle) of the vehicle at the time the image is recorded, and size of the vehicle, e.g., at least one of a length of the vehicle, width of the vehicle, and/or height of the vehicle. The information extracted that is particular to the vehicle may include the type of the vehicle, such as whether the vehicle is a truck, sport utility vehicle, sedan, wagon, sports car, etc. The type of vehicle may also be a manufacturer and/or color of the vehicle.

In some embodiments, the recognition of vehicles in the images may be performed using a computer vision module. The computer vision module may employ artificial intelligence utilizing computer software programs that analyze the images from the cameras 10 in order to recognize vehicles and other objects. The A.I. program functions by using machine vision. In some embodiments, the computer vision module includes at least one hardware processor for executing a series of instructions for analyzing the images taken by the camera 10, and comparing the images to comparison vehicles from the data saved in the stored reference images of vehicles. In some embodiments, for recognition of vehicles and determination of vehicle types, images taken of vehicles from the front, rear, right and left sides and specifications of the vehicles are held as data, e.g., data saved in the stored reference images of objects, for the respective types of the vehicle. Each of the vehicles recognized by the image analysis is compared with the images held as the data (data saved in the stored reference images of objects) to determine the type of the vehicle, and such information is associated with a vehicle model.

In some embodiments, the methods described herein can consider each of the frames of a video that is taken for analysis in the pseudo probes, as well as interpolate the date for missing frames in the video image. Referring to FIG. 1, in some embodiments of the method at block 9, data from the pseudo probes may be fed into existing types of simulation models. The pseudo probes take images from the fixed position camera 10. The fixed position camera may not necessarily capture each image point from which data is being recorded. For example, the fixed camera 10 may take frames of images of a vehicle as it is moving down a roadway, but the fixed camera 10 may not be able to supply frames of images of the vehicle throughout the entirety of the roadway. The portions of the roadway from which images of the vehicles are not taken may be referred to as "missing frames".

In some embodiments, various types of simulation models, e.g., the generated from the pseudo probes are recursively fed back to the generation of same or other pseudo probes to enhance the accuracy of the pseudo probes. Block 9 may include using the existing simulation model. The existing simulation models may include a vehicle model simulator 45 and a driver simulation model 50. By feeding data from the pseudo probes into the simulation models, and employing outputs from the simulation models for missing frames back into the simulation models, the accuracy of the pseudo probes can be enhanced.

FIG. 7 illustrates one projection of data onto a map, in which simulations, such as the vehicle model simulator 45 and driver model simulator 50, can provide data to fill data points not collected by video taken from a fixed position camera 10. In FIG. 7, the image, e.g., video image, that is taken from the fixed position camera 10. A vehicle 15 is recognized from the video image by the vehicle model simulator 45. Each image taken for the vehicle 15' is illustrated with a triangle shaped icon in FIG. 7.

The vehicle model simulator 45 can identify the vehicle model by image recognition and database matching. A "vehicle model" is a manufacturer make of a vehicle, as well as a designation for a model by the manufacturer. The model can designate the type of vehicle, e.g., a sedan, a sport utility vehicle, or a truck. In FIG. 7, the vehicle 15 that images are recording from the camera 10 is traveling over a passageway, such as a road. The vehicle 15 is tagged by the vehicle model simulator 45 for all of the frames from which images where taken. The system determines that frames along the passageway of the images taken by the fixed camera 10 are missing, i.e., there is no data on the vehicle being tracked. The missing frame is depicted in FIG. 7 by reference number 13.

Referring to FIG. 7, missing information, e.g., data for the missing frames 13, in the video image can supplemented by applying the vehicle model simulator 45. The missing information may include a missing vehicle model for a vehicle 15 that an image 11 was taken for, or the vehicle model for the missing frames 13. In some examples, a vehicle model that is highly similar to a vehicle from a frame 13 for which is missing is selected and a missing behavior of the vehicle is estimated and supplemented by a model. For example, if the vehicle model simulator 45 designated the vehicle 15 as a truck of model A for the images that have been recorded by the fixed position camera 10, the vehicle model simulator 45 may designate that in the missing frames 13, the vehicle 15 is a truck of vehicle model A. Alternatively, a vehicle model that is highly similar to a vehicle detected from the video image is applied to estimate a behavior of the vehicle in the next frame, enhancing the chronological tracking accuracy and identification accuracy. For example, if the vehicle 15 that is recorded in the image is a truck of model A, and the vehicle model simulator 45 does not recognize model A, the vehicle model simulator 45 can estimate from the images that the vehicle type is a truck of similar model, e.g., truck model B. This can provide similar simulation performance.

Still referring to FIG. 7, in some embodiments, the application of a driver model simulator 50 in addition to the to the above-described supplement of using a vehicle model simulator 45 can provide a more accurate behavior estimation and supplement. The driver model simulator 50 can provide an estimation of the motion characteristics of a vehicle 15. "Motion characteristics" may include the speed of a vehicle, selection of lane of the vehicle, acceleration and deceleration of a vehicle, as well as how the motion characteristics of a vehicle can change in response to changes in the vehicle. For example, if supplementing the data taken with the pseudo probes using a vehicle model alone is insufficient to track a vehicle, driver model simulations may increase the number of estimated patterns and a pattern that has a highest matching probability, and thus can be regarded as proper is selected. In some embodiments, this can facilitating converting the extracted vehicle behavior into the pseudo probe data at block 10 of the method illustrated in FIG. 1.

FIG. 7 depicts one embodiment of the driver model simulator 50 applying three different driver models, e.g., driver model (A), driver model (B), and driver model (C), for providing data for the missing frames. The system applies the most suitable behavior from the driver model simulation to provide data for the missing frames. The driver model simulator 50 and the vehicle model simulator 45 can provide the behavior prediction 14 for the missing frames 13. The driver model simulator 50 and the vehicle model simulator 45 may be provided by the vehicle motion simulator 60 of the system 500 depicted in FIG. 10.

Referring to FIG. 1, at block 11 the method can generate a traffic flow model (TM) 55 from the pseudo probes, e.g., fixed position cameras 10 that take images of the vehicles for generating the simulation data. In some embodiments, the behaviors of vehicles recorded in the pseudo probes, i.e., from the fixed position cameras 10, are converted into chronological data including the position, speed, acceleration/deceleration, direction and size (length, width and height of each vehicle) and the number of vehicles in the area (site 20). In some embodiments, the chronological data is divided according to characteristics that are external factors affecting a traffic flow, such as road shape characteristics (straight, curve, uphill, downhill), time periods, seasons and weathers. In the division, comparison with existing traffic flow models is performed, and if a certain degree of coincidence with an existing traffic flow model is detected, the relevant data is treated as being identical to the existing model to reduce analysis processing costs.

In some embodiments, the degrees of similarity between the divisional data blocks are calculated and an identification (ID) of a block that is highly similar to a relevant block is provided to the relevant block as information. This is intended to enable generating a wide variety of test scenarios even with traffic flow model combinations alone, by means of replacement between blocks that are highly similar to each other. Data included in each of the pseudo probes is compared with traffic flow models (including existing models) and divided at respective proper positions, and models having a high degree of coincidence are searched for. In analyzing the pseudo probes, results of analysis of traffic flows modeled in advance can easily be reused. For example, FIG. 8 illustrates employing the traffic model 55 to provide a traffic model for each division on the map that the extracted feature points and vehicles have been projected onto.

Figure 8:
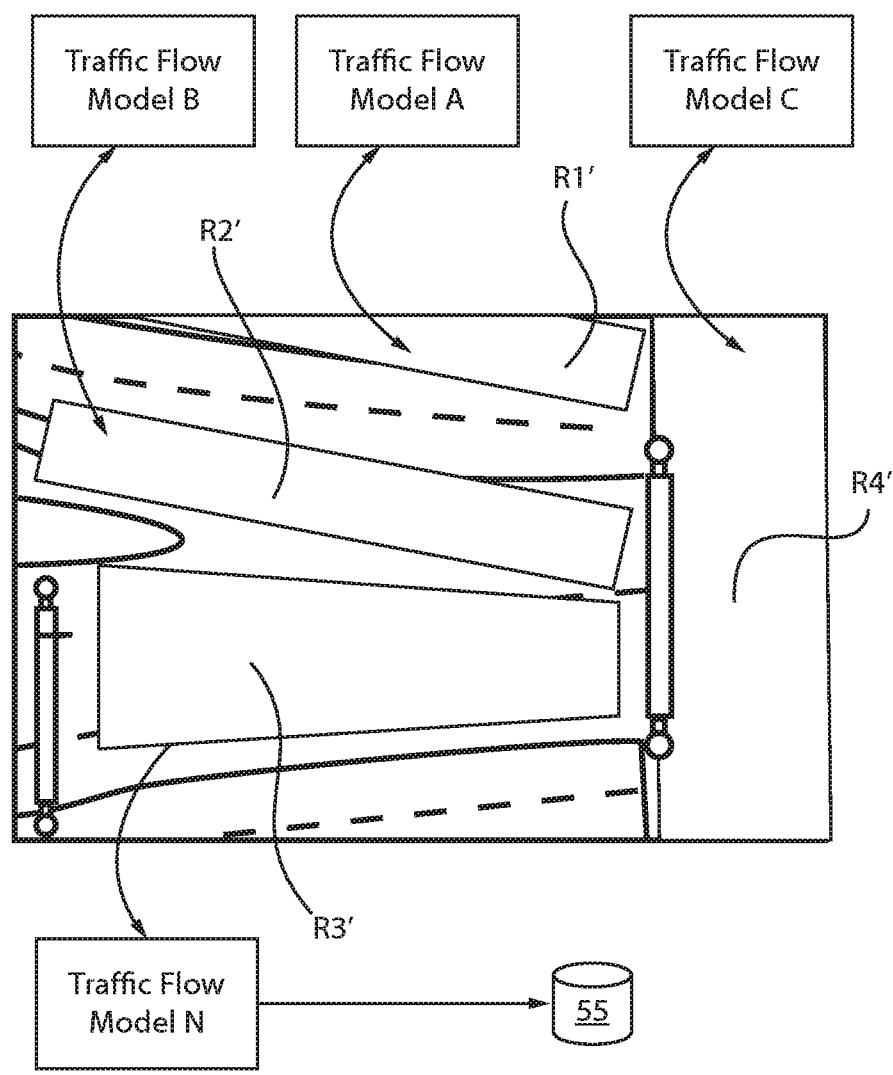
FIG. 8 is an illustration of employing a traffic model database to provide a traffic model for each division on the projected map.

FIG. 8 illustrates a traffic model 55, e.g., traffic flow model A, traffic flow model B, and traffic flow model C, for each of the divisional surrounding a division for which a traffic flow has not been generated. The system can perform a new analysis and generate a model, e.g., traffic flow model (N), with the result of the analysis. The analysis for generating the new traffic flow model (N) factors the traffic flow models, e.g., traffic flow model A, traffic flow model B, and traffic flow model C, for each of the divisional surrounding the division for which the traffic flow, e.g., traffic flow model (N), is being calculated.

In some embodiments, the method may continue to block 12, which includes generating vehicle model from the pseudo probes, e.g., fixed position cameras 10. In some embodiments, in each frame, the correlation between peripheral conditions in an area within a certain distance from a relevant vehicle (the number of peripheral vehicles, distances, speeds and angles relative to the peripheral vehicles and the road shape, the time period and the weather) and behaviors (acceleration/deceleration, steering and combinations thereof) of the relevant vehicle in the next frame onwards is extracted, feature values are analyzed and the model value of the feature values is modelled as a 'general vehicle behavior'. A behavior having a feature value difference that is equal to or exceeds a certain defined value, from the 'general vehicle model' is modeled as a 'peculiar vehicle behavior'. Peripheral conditions having a certain degree of correlation with the behavior are provided as information to the model. Data included in each of the pseudo probes is compared with vehicle models (including existing models) to associate the relevant vehicle with a model having a highest degree of coincidence. If there is no existing model exceeding the defined degree of coincidence, the vehicle is registered as a new vehicle model. The existing vehicle models are searched by the vehicle type assigned at the time of generation of the pseudo probe, and by comparing extracted feature values and the feature values of the existing vehicle model enables effective detection of a "peculiar behavior".

Block 13 of the method depicted in FIG. 1 includes generating driver models from the pseudo probes, i.e., images taken from fixed position cameras 10. In some embodiments, a significant difference exceeding a certain defined value is extracted as a coefficient from a plural vehicle models having attributes as the same vehicle type, and the coefficient is modelled as a driver that affects the final behavior of the vehicle. A group of coefficients falling within a certain range for a same action is defined as one driver model. Each of the extracted coefficients is compared with existing driver models and a coefficient having a certain degree of coincidence with an existing model is treated as the known model to efficiently build new driver models.

Figure 9:
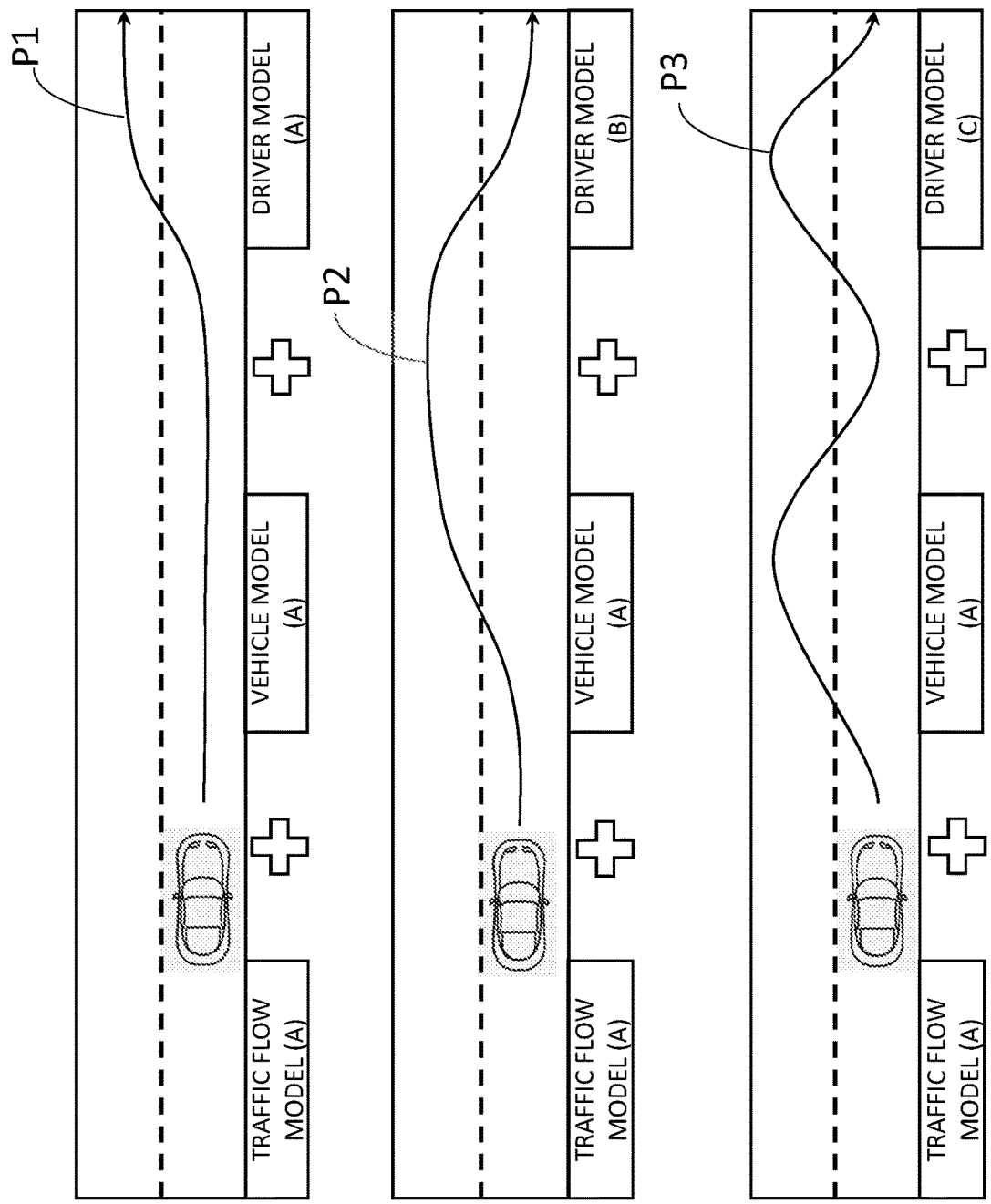
FIG. 9 illustrates one embodiment of running simulations using three different types of driver models with a single combination of traffic flow models and vehicle simulation models.

Block 14 of the method depicted in FIG. 2 includes generating test scenarios with the traffic flow models, the vehicle models and the driver models as inputs. In some embodiments, a variety of patterns of simulation scenarios following actual traffic flows are generated by dynamic combination of traffic flow models according to the respective degrees of similarity. In some embodiments, the variety of patterns are produced by the traffic pathway calculator 65 of the system 500 depicted in FIG. 10. For example, replacing vehicle model of particular vehicles on a certain traffic flow model can change expected behavior of vehicles. Furthermore, variation of scenarios can be increased very efficiently by replacing a model of a driver riding in the vehicle with a different driver model. FIG. 9 illustrates one embodiment of running simulations using three different types of driver models, e.g., driver model A, driver model B and driver model C, to a single combination of traffic flow models and vehicle models, e.g., a combination of traffic flow model A and vehicle model A. In this example, the effect of three different types of driver models can change behavior in the analysis by applying three different types of attributes from the different driver model. This can result in three different types of simulated paths P1, P2, P3 for the traffic flow and the vehicle model, as illustrated in FIG. 9. A broader range of simulation scenarios can efficiently be generated by dynamic combination of traffic flow models according to the respective degrees of similarity. The video image as input data does not necessarily need to cover the entire range (due to supplement by respective models is possible).

In the dynamic combination of traffic flow models, a coherent simulation scenario with no missing part can be generated by supplementing a traffic flow at a site at which a mismatch partially occurs, applying a dynamic scenario generated by vehicle models and driver models. Behaviors of vehicles are estimated by combination of traffic flow models, vehicle models and driver models.

In some embodiments, a behavior of an evaluation subject vehicle in an actual traffic flow can easily be evaluated by applying a simulation model of the vehicle to a traffic flow model, e.g., traffic flow model A. Changes in behavior of peripheral vehicles due to the presence of the evaluation subject vehicle are expressed by dynamic switching to a vehicle model (vehicle model A), and/or a driver model (driver model A) and the simulation can continuously be performed. In one example, as the vehicle approaches a traffic flow, through use of the vehicle model and the driver model, collision avoidance may be implemented by replacing the traffic flow model with the vehicle model, e.g., replacing traffic flow model A with vehicle model A and/or the driver model A.

FIG. 10 is a block diagram illustrating some components in a system 500 for generating traffic pathways using pseudo probe data. In on embodiment, the system for generating traffic pathways on a transportation site includes an interface 21 for receiving images recorded from the transportation site by a fixed position camera 10. The system 500 may further include an image to map converter 22 for projecting the recorded images onto a map, wherein extracted fixed image features from the recorded images substantially match extracted fixed map features from the map to correlate the map to the transportation site. The system 500 also includes an image data 23 for extracting vehicle point data from the images recorded by the fixed position camera. A traffic flow model 55 calculates a simulated traffic flow from the vehicle point data. A vehicle motion simulator 60 calculates simulated vehicle motion from the vehicle point data. The system 500 may also include a traffic pathway calculator 65 including a hardware processor 66 configured for generating a traffic pathway from the simulated vehicle motion and the simulated traffic flow, wherein the traffic pathway is for directing a guided vehicle on the transportation site. The bus 102 interconnects the plurality of components in the system 500. Data may be stored in the storage device 29 for the pseudo probe generated scenarios.

As employed herein, the term "hardware processor subsystem" or "hardware processor" can refer to a processor, memory, software or combinations thereof that cooperate to perform one or more specific tasks. in useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.). In some embodiments, the hardware processor subsystem can include and execute one or more software elements. The one or more software elements can include an operating system and/or one or more applications and/or specific code to achieve a specified result. In other embodiments, the hardware processor subsystem can include dedicated, specialized circuitry that performs one or more electronic processing functions to achieve a specified result. Such circuitry can include one or more application-specific integrated circuits (ASICs), FPGAs, and/or PLAs. These and other variations of a hardware processor subsystem are also contemplated in accordance with embodiments of the present invention.

Additionally, the system 500 that is depicted in FIG. 10 may be integrated into the processing system 400 depicted in FIG. 11. The processing system 400 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102. The bus 102 interconnects a plurality of components has will be described herein.

The processing system 400 depicted in FIG. 11, may further include a first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 152, 154, and 156 can be the same type of user input device or different types of user input devices. The user input devices 152, 154, and 156 are used to input and output information to and from system 400.

Of course, the processing system 400 may also include other elements (not shown), as readily contemplated by one of skill in the art, as well as omit certain elements. For example, various other input devices and/or output devices can be included in processing system 400, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 400 are readily contemplated by one of ordinary skill in the art given the teachings of the present invention provided herein.

The present invention may be a system, a method, and/or a computer program product at any possible technical detail level of integration. The computer program product may include a computer readable storage medium (or media) having computer readable program instructions thereon for causing a processor to carry out aspects of the present invention.

For example, the present disclosure provides a computer program product that includes a non-transitory computer readable storage medium having computer readable program code embodied therein for a method of generating traffic pathways on a transportation site. The method actuated by the computer program product may include recording images from the transportation site with a fixed position camera; and projecting the recorded images onto a map. Extracted fixed image features from the recorded images are substantially matched to extracted fixed map features from the map to correlate the map to the transportation site. In some embodiments, the method further includes extracting vehicle point data from the images recorded by the fixed position camera; and calculating projected vehicle characteristics from the extracted point data to provide a vehicle continuous data set for the vehicle being imaged by the fixed position camera. The method may further include generating a simulated traffic flow from the vehicle continuous data set; and generating simulated vehicle motion from the vehicle continuous data set. A traffic pathway can be generated using the simulated vehicle motion and the simulated traffic flow. The traffic pathway is for directing a guided vehicle on the transportation site.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The methods of the present disclosure may be practiced using a cloud computing environment. Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models. Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings:

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load balancing between clouds).

A cloud computing environment is service oriented with a focus on statelessness, low coupling, modularity, and semantic interoperability. At the heart of cloud computing is an infrastructure comprising a network of interconnected nodes.

Figure 12:
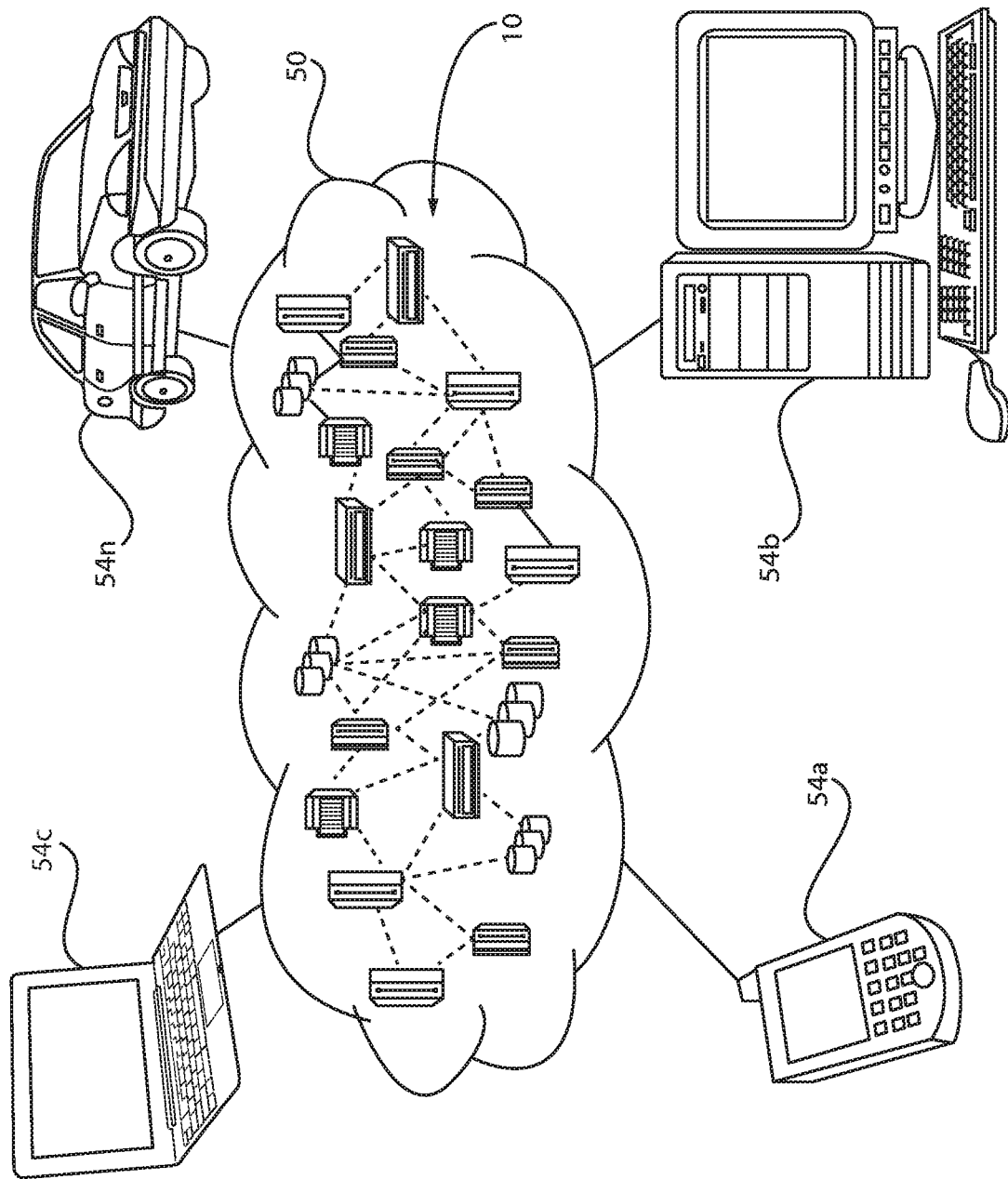
FIG. 12 is a block diagram showing an illustrative cloud computing environment having one or more cloud computing nodes with which local computing devices used by cloud consumers communicate in accordance with one embodiment.

Referring now to FIG. 12, illustrative cloud computing environment 50 is depicted. As shown, cloud computing environment 50 includes one or more cloud computing nodes 51 with which local computing devices used by cloud consumers, such as, for example, mobile and/or wearable electronic devices 54A, desktop computer 54B, laptop computer 54C, and/or automobile computer system 54N may communicate. Nodes 110 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 12 are intended to be illustrative only and that computing nodes 51 and cloud computing environment 50 can communicate with any type of computerized device over any type of network and/or network addressable connection (e.g., using a web browser).

Figure 13:
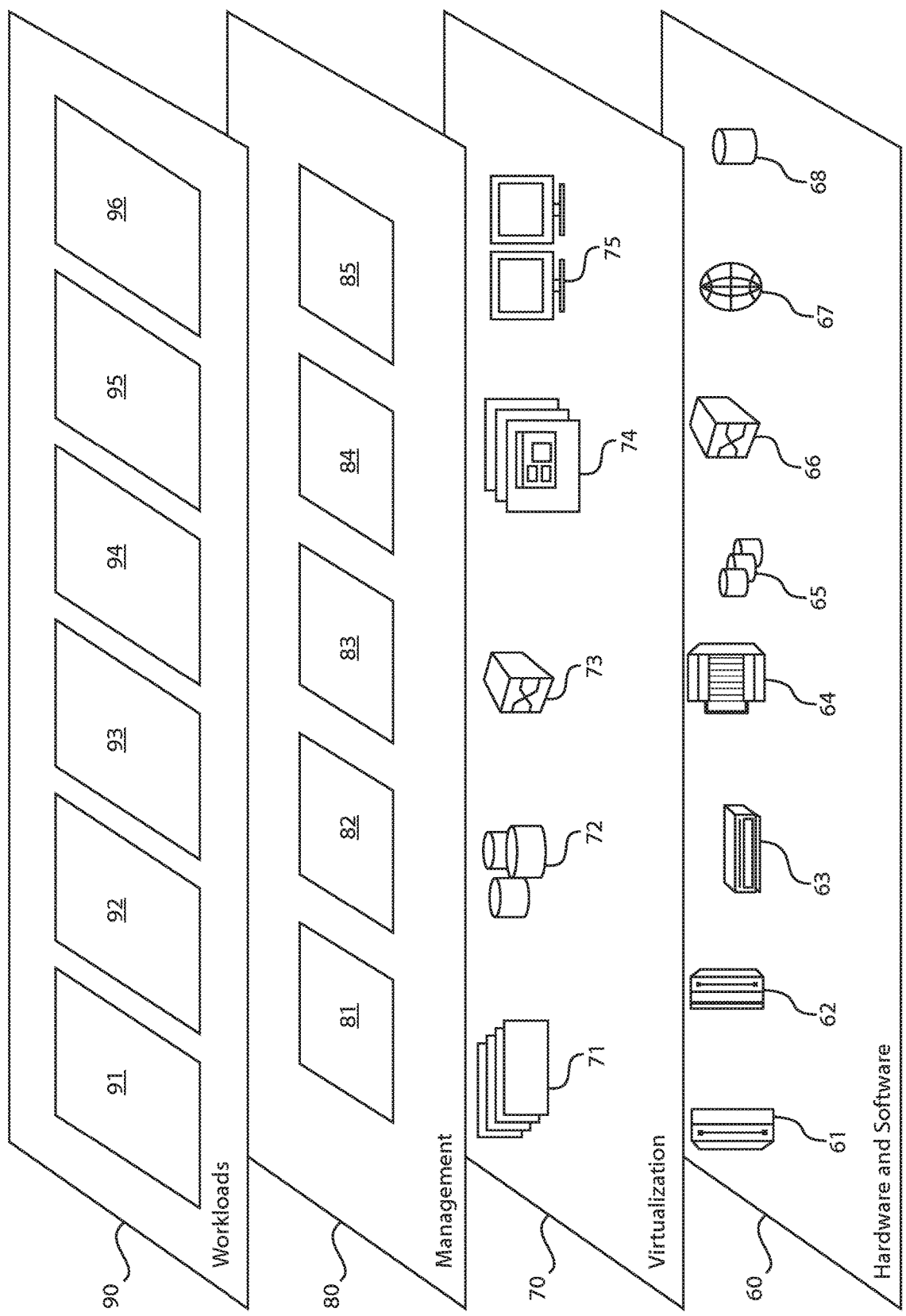
FIG. 13 is a block diagram showing a set of functional abstraction layers provided by a cloud computing environment in accordance with one embodiment.

Referring now to FIG. 13, a set of functional abstraction layers provided by cloud computing environment 50 (FIG. 12) is shown. It should be understood in advance that the components, layers, and functions shown in FIG. 13 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and application 96 for generating traffic pathways using pseudo probes, which is described with reference to FIGS. 1-12.

Having described preferred embodiments of a pseudo probe data generating system for a simulator (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A computer implemented method for generating traffic pathways on a transportation site comprising:
   recording images from the transportation site with a fixed position camera;
   projecting the recorded images onto a map, wherein extracted fixed image features from the recorded images match extracted fixed map features from the map to correlate the map to the transportation site;
   extracting vehicle point data from the images recorded by the fixed position camera, the vehicle point data extracted from images of vehicles traveling on the transportation site taken by the fixed position camera;
   calculating projected vehicle characteristics from the extracted vehicle point data to provide a vehicle continuous data set for a vehicle being imaged by the fixed position camera, wherein the calculating of the projected vehicle characteristics includes dividing the map into divisions for extracted vehicle point data and divisions that do not include extracted vehicle point data, and calculating projected point data to supplement the extracted vehicle point data from the divisions not including said extracted vehicle point data with a historical vehicle model;
   generating a simulated traffic flow from the vehicle continuous data set;
   generating simulated vehicle motion from the vehicle continuous data set;
   generating a traffic pathway using the simulated vehicle motion and the simulated traffic flow, wherein the traffic pathway is for directing a guided vehicle on the transportation site; and
   actuating the guided vehicle using the traffic pathway.

2. The computer implemented method of claim 1, wherein said guided vehicle is an autonomous vehicle.

3. The computer implemented method of claim 1, wherein said recording images comprises a motion picture recordation.

4. The computer implemented method of claim 1, wherein said extracted fixed image features are selected from roads, traffic signage, geographic features, architectural features and combinations thereof.

5. The computer implemented method of claim 1, wherein projecting the recorded images onto the map comprises dividing the recording images into patterns on the map, wherein each pattern on the map is a region for said extracting vehicle point data.

6. The computer implemented method of claim 1, wherein said vehicle point data is selected from the group consisting of size, speed, acceleration, direction and combinations thereof.

7. The computer implemented method of claim 1, wherein the simulated traffic flow from the vehicle continuous data set is a traffic trend calculated for the vehicle continuous data set for all vehicles on said transportation site.

8. The computer implemented method of claim 7, wherein factors impacting the simulated traffic flow include the extracted fixed image features and traffic obstructions.

9. The computer implemented method of claim 1, wherein the simulated vehicle motion is calculated based on a model selected from a group consisting of a vehicle model simulation component calculated from the vehicle continuous data set, a driver model simulation component calculated from the vehicle continuous data set, and combinations thereof.

10. The computer implemented method of claim 9, wherein the vehicle model simulation component provides predictive vehicle motion based on vehicle performance dependent upon a vehicle classification selected from a group consisting of vehicle type, vehicle model, vehicle manufacturer and combinations thereof.

11. The computer implemented method of claim 9, wherein the driver model simulation component is a probability of how a driver will navigate a vehicle responsive to the extracted fixed image features and variables from the vehicle model simulation component.

12. A system for generating traffic pathways on a transportation site comprising:
    an interface for receiving images recorded from the transportation site by a fixed position camera;
    an image to map converter for projecting the recorded images onto a map, wherein extracted fixed image features from the recorded images match extracted fixed map features from the map to correlate the map to the transportation site;
    an image data extractor for extracting vehicle point data from the images recorded by the fixed position camera, the vehicle point data extracted from images of vehicles traveling on the transportation site taken by the fixed position camera;
    a traffic pathway calculator that calculates projected vehicle characteristics by dividing the map into divisions for extracted vehicle point data and divisions that do not include extracted vehicle point data, and calculating projected point data to supplement the extracted vehicle point data from the divisions not including said extracted vehicle point data with a historical vehicle model;
    a traffic flow simulator that calculates a simulated traffic flow from the vehicle point data;
    a vehicle motion simulator that calculates simulated vehicle motion from the vehicle point data; and
    a traffic pathway calculator including a processor configured for generating a traffic pathway from the simulated vehicle motion and the simulated traffic flow, wherein the traffic pathway is for directing a guided vehicle on the transportation site; and
    actuating the guided vehicle using the traffic pathway.

13. The system of claim 12, wherein the vehicle motion simulator includes a vehicle simulation model.

14. The system of claim 13, wherein the vehicle simulation model provides predictive vehicle motion based on vehicle performance dependent upon a vehicle classification selected from the group consisting of vehicle type, vehicle model, vehicle manufacturer and combinations thereof.

15. The system of claim 12, wherein the vehicle motion simulator includes a driver model simulation component.

16. The system of claim 15, wherein the driver model simulation component is a probability of how a driver will navigate a vehicle responsive to the extracted fixed image features and variables from a vehicle model simulation component.

17. The system of claim 12, wherein said guided vehicle is an autonomous vehicle.

18. The system of claim 12, wherein said recording images comprises a motion picture recordation.

19. A computer program product for generating traffic pathways on a transportation site, the computer program product comprising a computer readable storage medium having computer readable program code embodied therewith, the program instructions executable by a processor to cause the processor to:

record images, using the processor, from the transportation site with a fixed position camera;

project the recorded images onto a map, using the processor, wherein extracted fixed image features from the recorded images match extracted fixed map features from the map to correlate the map to the transportation site;

extract vehicle point data, using the processor, from the images recorded by the fixed position camera, wherein said vehicle point data is selected from the group consisting of size, speed, acceleration, direction and combinations thereof;

calculate projected vehicle characteristics, using the processor, from the extracted vehicle point data to provide an extracted vehicle continuous data set for a vehicle being imaged by the fixed position camera, wherein said calculating projected vehicle characteristics from the extracted vehicle point data to provide the vehicle continuous data set comprises dividing the map into divisions, determining which of said divisions on said map correspond to locations in said images where said extracted vehicle point data was taken and which divisions do not include said extracted vehicle point data, and calculating projected point data from the divisions not including said extracted vehicle point data with a historical vehicle model, and combining the extracted vehicle point data and the projected point data to provide the vehicle continuous data set;

generate, using the processor, a simulated traffic flow from the extracted vehicle continuous data set;

generate, using the processor, simulated vehicle motion from the extracted vehicle continuous data set;

generate, using the processor, a traffic pathway using the simulated vehicle motion and the simulated traffic flow, wherein the traffic pathway is for directing a guided vehicle on the transportation site; and actuating the guided vehicle using the traffic pathway.

* * * * *